PROCESS FOR FABRICATING MONOLITHIC CIRCUITS HAVING
MATCHED COMPLEMENTARY TRANSISTORS AND PRODUCT

Filed June 30, 1967 2 Sheets-Sheet 1

1

3,465,215

PROCESS FOR FABRICATING MONOLITHIC CIRCUITS HAVING MATCHED COMPLEMENTARY TRANSISTORS AND PRODUCT

Ralph O. Bohannon, Jr., and Robert A. Stehlin, Richardson, Tex., assignors to Texas Instruments Incorporated, Dallas, Tex. a corporation of Delaware

Filed June 30, 1967, Ser. No. 650,303
Int. Cl. H01l *11/00, 7/00*
U.S. Cl. 317—235 7 Claims

ABSTRACT OF THE DISCLOSURE

A process for fabricating a monolithic circuit having a matched pair of complementary transistors, a diffused resistor, and a diode. The starting material is a p-type substrate having heavily doped n-type diffused regions buried under an n-type epitaxial layer at each position where a transistor is to be formed. First a p-type diffusion is made to form the collector of the PNP transistor and an isolation ring around each buried n-type diffused region. The p-type diffusion is made to a depth sufficient to penetrate through the epitaxial layer to the p-type substrate to form isolation rings. However, where a PNP transistor is to be formed, the buried n-type region isolates the p-type collector region from the p-type substrate. Then a first n-type diffusion forms the base of the PNP transistor, and a second p-type diffusion forms the base of the NPN transistor, the resistors, and the anode of the diode. A third p-type diffusion forms the emitter of the PNP transistor, and finally a second n-type diffusion forms the emitter of the NPN transistors.

This invention relates generally to semiconductor devices, and more particularly relates to the fabrication of monolithic silicon circuits having matched complementary PNP and NPN bipolar transistors.

There are many instances when it is desirable to use complementary transistors in monolithic circuits. One example is the micropower logic circuit described in copending U.S. application Ser. No. 552,258, entitled "High Speed, Low Power Logic Gate," filed on behalf of George W. Niemann on Apr. 18, 1966, by the assignee of the present invention which uses a pair of complementary bipolar transistors as the output state of logic gates to achieve low standby power. In order to achieve optimum performance in such a circuit, the complementary transistors must be well matched. However, it is generally very difficult to achieve complementary transistors in monolithic circuit form having matched operating parameters. It is also difficult to achieve large resistance values necessary for micropower operation when building circuits in monolithic form.

A number of processes heretofore proposed and utilized produce integrated circuits with both PNP and NPN transistors on the same substrate. In the most common process, the PNP transistors are formed by utilizing the base and collector diffusions of the NPN transistors and the p-type substrate. However, the use of the same diffusions to form different components must necessarily result in the trade off of desirable operational parameters between the NPN and the PNP devices. As a general rule, when a p-type substrate is used, the PNP transistor is of low quality, and when an n-type substrate is used, the NPN device is of low quality. In some processes, additional diffusion cycles are used to improve the electrical characteristics of the PNP transistor. Some of these processes are described in "Designing a Microelectronic Differential Amplifier," Electron Products, pp. 34–37, July 1962; "Low Power Integrated Circuits," Westcon Electronics Show and Convention, 1965, Session I; and "Lateral Complementary Transistor Structure For the Simultaneous Fabrication of Functional Blocks," Proceedings of the IEEE, pp. 1491–1495, December 1964. In general, these processes yield good complementary transistors with substantially equal characteristics, but are so complex as to not be suitable for mass production operations. In production runs, the yield of good devices tends to decrease exponentially with the number of diffusion steps involved in the process.

2

In accordance with this invention, a relatively simple process involving five diffusions, the first of which is noncritical, produces a monolithic circuit having both NPN and PNP transitors with closely matched parameters of high values. In addition, the process provides diffused resistors having high sheet resistance values, typically from 500–600 ohms per square. In addition, all components are individually isolated.

The process in accordance with the present invention utilizing a starting material comprised of a p-type silicon substrate with an n-type epitaxial layer extending over the entire substrate. A heavily doped n-type diffused region is provided in the p-type substrate under each area where a component is to be formed in the n-type epitaxial layer. A p-type diffusion is made to form the collector of the PNP transistor, one junction of any capacitors, and an isolation ring around each area where a component is to be formed. The p-type diffusion is of sufficient depth to extend through the epitaxial layer into the p-type substrate to complete isolation, but the n-type buried diffusion isolates the collector of the PNP transistor from the p-type substrate. Next, the base of the PNP transistor is diffused, followed by the base of the NPN transistor. The base diffusion for the NPN transistor is made very shallow in order to provide a very high sheet resistance, and also forms the anode for any diodes. Then the emitters of the PNP and NPN transistors are successively diffused.

The monolithic circuit resulting from the process is comprised of a p-type substrate with an n-type epitaxial overlay divided into isolated pockets by p-type diffused rings extending through the epitaxial layer to the p-type substrate. A PNP transistor is formed in one isolated pocket by three diffused regions, the first of which extends all the way to the underlying n-type region and therefore provides a low resistance path for collector current. An NPN transistor is formed by two diffused regions and the epitaxial layer with the n-type diffused region buried under the epitaxial layer forming a low resistivity path.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
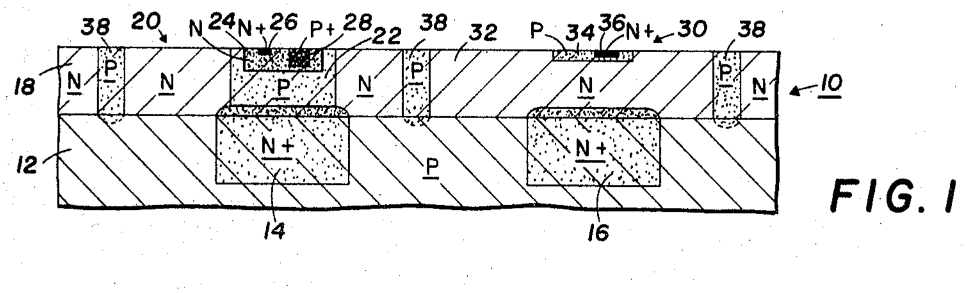
FIGURE 1 is a schematic sectional view illustrating a monolithic circuit constructed in accordance with the present invention.

Referring now to the drawings, a monolithic circuit constructed in accordance with the present invention is indicated generally by the reference numeral 10 in FIGURE 1. The monolithic circuit 10 is formed in an n-type epitaxial layer 18 on a p-type silicon substrate 12. Heavily doped n-type diffused regions 14 and 16 are formed in the substrate 12 under the epitaxial layer 18. A PNP transistor, indicated generally by the reference numeral 20, is formed by a diffused collector region 22, a diffused base region 24 having a diffused base contact 26, and a diffused emitter region 28. An NPN transistor, indicated generally by the reference numeral 30, has a collector region 32 formed by a portion of the epitaxial layer 18, a base region formed by diffused region 34, and an emitter region formed by diffused region 36. The transistors 20 and 30 are isolated one from the other, and from other components in the circuit, by isolation rings formed by diffusion 38 which extend through the epitaxial layer 18 into the substrate 12. The buried n-type diffused region 14 isolates the collector region 22 of the PNP transistor from the substrate 12, while the buried diffused region 16 provides a low resistance path for collector current to the NPN transistor 30.

Figure 2:
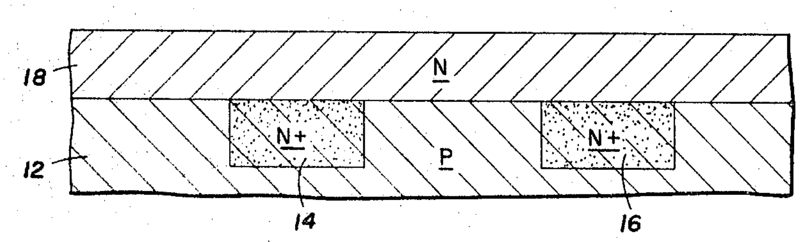
FIGURES 2–6 are schematic sectional views similar to FIGURE 1 illustrating successive steps in the process for fabricating the monolithic circuit of FIGURE 1.

The monolithic circuit 10 may be fabricated in accordance with the following process. The starting material is illustrated in FIGURE 2 and is a p-type silicon substrate 12 having a resistivity of 10–15 ohm-centimeters and a typical thickness of 0.010 inch. The diffused regions 14 and 16 are doped with antimony and have a surface concentration of about $1\times10^{18}$ atoms/cc., a resistivity of about 0.02 ohm-centimeter, and a depth of about ten microns. The epitaxial layer 18 which overlies the substrate 12 and the diffused regions 14 and 16 is also n-type silicon doped with antimony, has a resistivity of about 0.2 ohm-centimeter, and is about ten microns thick.

Figure 3:
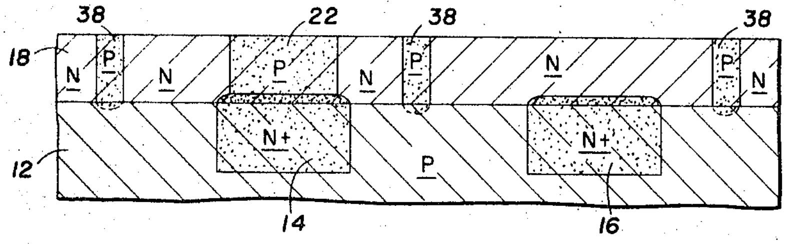
Figure 4:
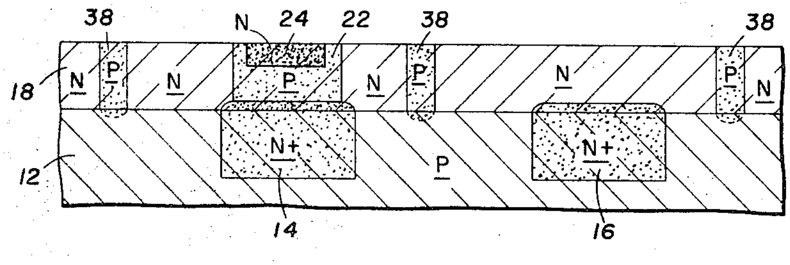
Figure 5:
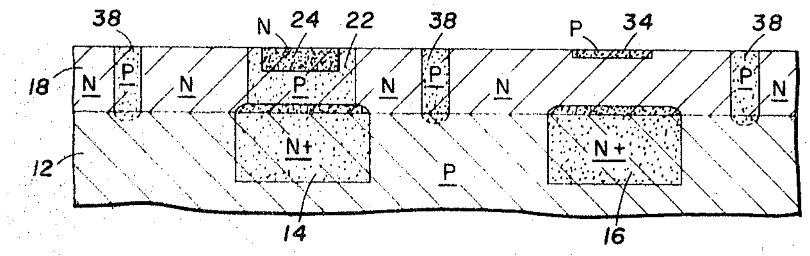
Figure 6:
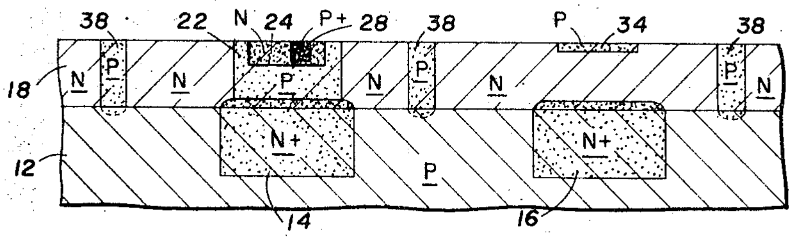

The first step of the process is a p-type diffusion to form the collector region 22 of the PNP transistor 20 and the isolation rings 38, substantially as illustrated in FIGURE 3. The diffusion is made by first placing the substrate in a deposition furnace, heating the substrate to about 975° C., purging the deposition chamber with nitrogen for about five minutes, passing a conventional reactant stream containing boron tribromide ($BBr_3$) through the deposition chamber for about twenty minutes, and then purging the chamber with nitrogen for another five minutes. The substrate is then subjected to a conventional deglaze step and placed in a diffusion furnace where it is heated to about 1200° C. while the diffusion furnace is first purged with oxygen for about five minutes, then filled with steam for about thirty minutes, then purged with nitrogen for about five minutes. The temperature of the substrate is then raised to about 1250° C. for about eight hours using an oxygen atmosphere.

The impurity concentration at the surface resulting from the p-type diffusion is about $2\times10^{18}$ atoms/cc. The p-type collector region 22 forms a junction with the underlying heavily doped n-type region 14 at a depth of about 8.5 microns as a result of the diffusion of the antimony upwardly from the diffused region 14. The p-type region 38 forming the isolation rings, however, extends downwardly to a depth of about 11.5 microns, which is well into the p-type substrate 12. The resulting sheet resistance of the collector region is about 70 ohms per square.

The next step is to diffuse the base region 24 of the PNP transistor. The surface concentration of the diffused n-type region 24 is kept as low as possible and still achieve the desired depth for the collector-base junction. Phosphorus is used as the n-type dopant and is deposited from phosphorus oxytrichloride ($POCl_3$) at a substrate temperature of about 800° C. The deposition period is about twenty-five minutes, preceded and followed by five minute nitrogen purges. After a deglazing step, the sheet resistance is about 150–160 ohms per square. The phosphorus introduced is then diffused at 1200° C. using a ten minute nitrogen purge, followed by twenty minutes in a steam atmosphere and sixty minutes in an oxygen atmosphere. At this point, the sheet resistance is about fifty ohms per square and the depth of the diffusion is about 1.6 microns and the surface concentration of the diffused region 24 is about $1\times10^{19}$.

Next, the base region 34 of the NPN transistor 30 is diffused. Boron is again used as the doping impurity and is deposited from a boron tribromide ($BBr_3$) source. The deposition is carried out at a substrate temperature of about 900° C. for a period of about twenty minutes, preceded and followed by five minute purge periods. After a deglazing step, the sheet resistance is about 100–105 ohms per square. The boron is then diffused at about 1050° C., using a ten minute prepurge followed by twenty-five minutes in a steam atmosphere and twenty minutes in an oxygen atmosphere. The impurity concentration at the surface is about $5\times10^{18}$ atoms/cc. The final sheet resistance of diffusion 34 is about 550 ohms per square and has a depth of 0.96 micron.

Next, the emitter region 28 of the PNP transistor is formed. This is again a boron deposition from boron tribromide and may be carried out at a substrate temperature of about 1100° C. for a period of about eight minutes, preceded and followed by two minute purge periods. The impurity concentration at the surface is about $4\times10^{20}$ atoms/cc., and the junction depth is about 1.1 microns.

Since no oxide layer is grown during the low temperature diffusion of the emitter region 28, the substrate is then covered with a layer of oxide deposited by the thermal decomposition of tetraethyl orthosilane to cover the windows through which the emitter diffusion 28 was made.

Figure 7:
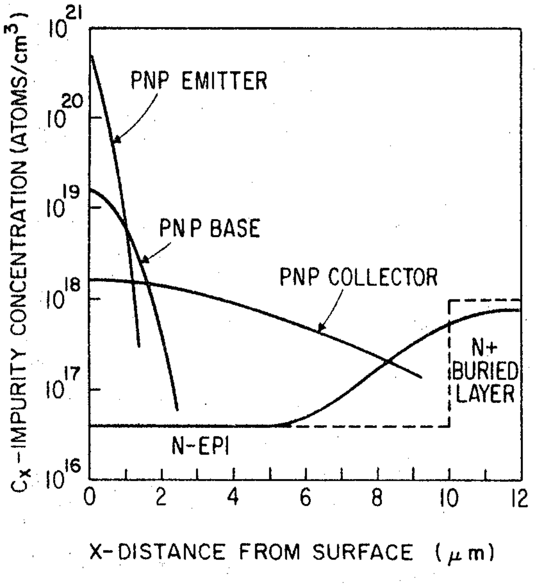
FIGURE 7 is a graph showing the impurity profile of the PNP transistor of the monolithic circuit of FIGURE 1.
Figure 8:
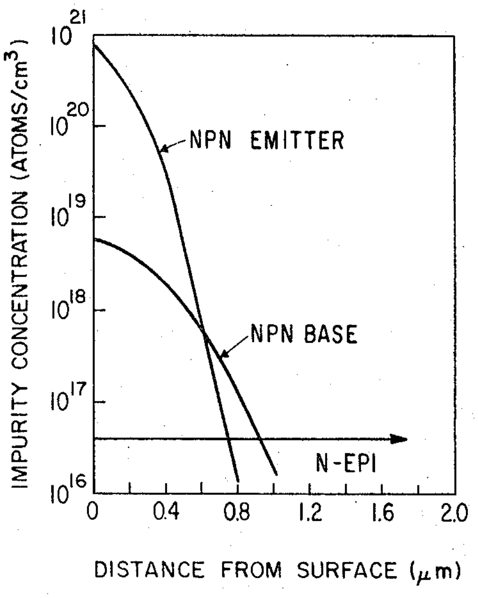
FIGURE 8 is a graph showing the impurity profile of the NPN transistor of the monolithic circuit of FIGURE 1.

Finally, the emitter region 36 of the NPN transistor and the base contact region 26 of the PNP transistor are diffused. The deposition is made from phosphorus oxytrichloride ($POCl_3$) at a substrate temperature of about 1000° C. for eight minutes, preceded and followed by two minute purge periods. The surface concentration of the final diffusion is about $1\times10^{21}$ atoms/cc., and the diffusion depth is about 0.5 micron. The final impurity profiles of the PNP and NPN transistors are shown in FIGURES 7 and 8, respectively.

Figure 9:
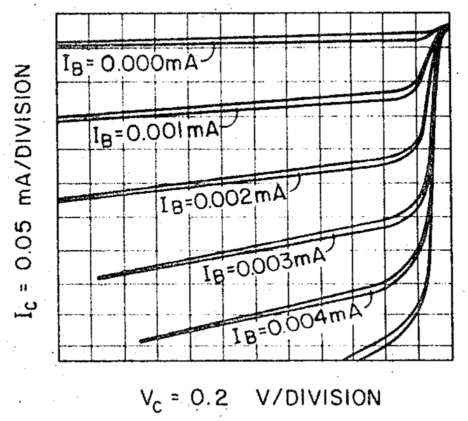
FIGURE 9 is a graph illustrating the current-voltage characteristics of the PNP transistor of the monolithic circuit of FIGURE 1.
Figure 10:
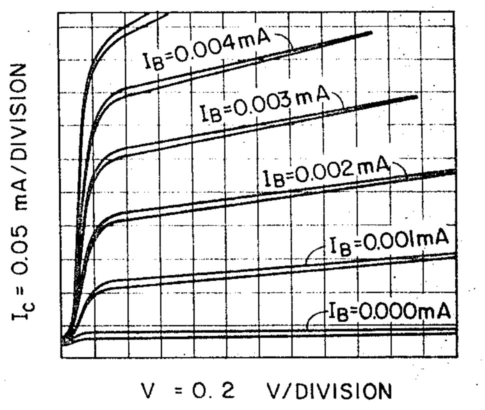
FIGURE 10 is a graph illustrating the current-voltage characteristics of the NPN transistor of the monolithic circuit of FIGURE 1.

The resulting PNP transistor has an $h_{FE}$ value of about 90–110, and the NPN transistor has an $h_{FE}$ value of from about 100 to about 120 at low currents. The current-voltage characteristics of the PNP and NPN transistors are shown in FIGURES 9 and 10, respectively. The other operational parameters are also quite close. The process entails only five diffusion steps, and only seven photolithographic steps. The diffusion step used to form the base region 3 of the NPN transistor provides a means for simultaneously forming resistors having a sheet resistance of from about 500 to about 600 ohms per square, thus making the very large resistance values required for micropower operation realizable within a practical area. Capacitors having high Q values and high capacitance per square area can also be formed by using the junction formed between the collector diffusion 22 and the underlying heavily doped n-type region to form one junction of the capacitor, and the junction formed between the final n-type diffusion and the collector diffusion 22 to form the other junction. Of course, any junction desired can be used for the diodes. Thus, all components necessary to form a monolithic circuit can be fabricated using the five diffusion steps. Furthermore, each component is disposed within a pocket in the epitaxial layer 18 that is wholly isolated by a PN junction. The buried n-type region 14 isolates the collector region 22 of the PNP transistor from the p-type substrate 12. The n-type buried diffused region 16 provides a low resistivity path for collector current to the NPN transistor. The temperature coefficient of the diffusion used to form base region 34 and the resistors is sufficently high to effectively compensate for changes in the base-emitter voltage of the transistors to provide more stable circuit operation.

Although preferred embodiments of the invention have been described in detail, it is to be understood that various changes, substitutions and alternations can be made therein without departing from the spirit and scope of the invention as defined by the appended claims.

What is claimed is:

1. A monolithic integrated circuit including a matched pair of complimentary bipolar transistors comprising in combination:

(a) a substrate of one conductivity type;

(b) an epitaxially formed layer of opposite conductivity type extending over substantially the entire area of one surface of said substrate;

(c) a plurality of diffused isolation rings of said one conductivity type extending through said epitaxial layer to said substrate so as to form a plurality of electrically isolated pockets;

(d) a first transistor formed within a first one of said pockets, said first transistor including (1) a diffused collector region of said one contivity type formed within said first pocket, (2) a diffused base region of said other conductivity type formed within said collector region, (3) a diffused emitter region of said one conductivity type formed within said base region, and (4) a diffused base contact region of said other conductivity type formed within said base region spaced from said emitter region;

(e) a second transistor formed within a second one of said pockets, said second transistor including (1) a diffused base region of said one conductivity type formed within said second pocket, and (2) a diffused emitter region of said other conductivity type formed within said base region, and wherein (3) the epitaxial layer electrically isolated within said second pocket forms the collector region of said second transistor; and (f) first and second buried diffused regions of said other conductivity type respectively formed within said first and second pockets spaced from their respective isolation ring, said buried regions each being formed primarily within said substrate but partially within said epitaxial layer with each underlying but spaced from their respective base and emitter regions of said first and second transistors; whereby (g) said first region isolates the collector of said first transistor from said substrate, and said second buried region provides a low resistance path for collector current in said second transistor.

2. The monolithic integrated circuit of claim 1 wherein said one conductivity is p-type and said other conductivity is n-type.

3. The monolithic integrated circuit of claim 1 wherein said first and second transistors are respectively PNP and NPN type transistors.

4. The monolithic integrated circuit of claim 1 wherein:

(a) said substrate is p-type silicon; and wherein (b) said epitaxial layer is n-type silicon having an impurity concentration on the order of $5\times10^{16}$ atoms/cc.; and wherein (c) said buried regions are doped with antimony to a surface concentration on the order of $1\times10^{18}$ atoms/cc.; and extend to a depth on the order of 10.0 microns; and wherein (d) said collector region of said first transistor is doped with boron to a surface concentration on the order of $2\times10^{18}$ atoms/cc. and extends to the underlying buried diffused region; and wherein (e) said base region of said first transistor is doped with phosphorus to a surface concentration on the order of $1\times10^{19}$ atoms/cc. and extends to a depth on the order of 1.6 microns; and wherein (f) said emitter region of said first transistor is doped with boron to a surface concentration on the order of $4\times10^{20}$ atoms/cc. and extends to a depth on the order of 1.1 microns; and wherein (g) said base region of said second transistor is doped with boron to a surface concentration on the order of $5\times10^{18}$ atoms/cc. and extends to a depth on the order of 0.96 micron; and wherein (h) said emitter region of said second transistor is doped with phosphorus to a surface concentration on the order of $1\times10^{21}$ atoms/cc. and extends to a depth on the order of 0.5 micron.

5. A process for fabricating a monolithic integrated circuit having matched bipolar transistors comprising the following steps:

(a) diffusing into a substrate of one conductivity type at least first and second regions of opposite conductivity type;

(b) epitaxially forming a layer of material over said substrate and said first and second regions;

(c) diffusing a plurality of isolation rings of said one conductivity type so as to extend completely through said epitaxial layer and partially into said substrate, said isolation rings forming a plurality of electrically isolated pockets with a first and second of said pockets respectively circumscribing said first and second regions;

(d) diffusing a first collector region of said one conductivity type within said first pocket spaced from its respective isolation ring, said collector region extending through said epitaxial layer to said first region;

(e) diffusing a first base region of said other conductivity type within said first collector region;

(f) diffusing a second base region of said one conductivity type within said second pocket spaced from its respective isolation ring and said second region;

(g) diffusing a first emitter region of said one conductivity type within said first base region;

(h) diffusing a second emitter region of said conductivity type within said second base region; and (i) diffusing a base contact region of said other conductivity type within said first base region spaced from said first emitter region; wherein (j) said first collector, base, and emitter regions form a first transistor, and said second base and emitter regions and the epitaxial layer of material within said second pocket form a second transistor that is complementary to said first transistor; and wherein (k) said first region isolates the collector of said first transistor from said substrate, and said second region provides a low resistance path for collector current in said second transistor.

6. The process of claim 5 wherein said one conductivity is p-type and said other conductivity is n-type; and wherein said first and second transistors are respectively PNP and NPN type transistors.

7. The process of claim 5 wherein (a) said substrate is p-type silicon having a thickness on the order of 0.010 inch; and wherein (b) said epitaxial layer is n-type silicon having an impurity concentration on the order of $5\times10^{16}$ atom/cc.; and wherein (c) said first and second regions are doped with antimony to a surface concentration on the order of $1\times10^{18}$ atoms/cc. and extend to a depth on the order of 10.0 microns; and wherein (d) said first collector region is doped with boron to a surface concentration on the order of $2\times10^{18}$ atoms/cc. and extends to said first region; and wherein (e) said first base region is doped with phosphorus to a surface concentration on the order of $2\times10^{19}$ atoms/cc. and extends to a depth on the order of 1.8 microns; and wherein (f) said first emitter region is doped with boron to a surface concentration on the order of $7\times10^{20}$ atoms/cc. and extends to a depth on the order of 1.1 microns; and wherein (g) said second base region is doped with boron to a surface concentration on the order of $5\times10^{18}$ atoms/cc. and extends to a depth on the order of 0.96 micron; and wherein (h) said second emitter region and said base contact region are each doped with phosphorous to a surface concentration on the order of $1\times10^{21}$ atoms/cc. and each extends to a depth on the order of 0.5 micron.

References Cited

UNITED STATES PATENTS

| | | | |
|---|---|---|---|
| 3,327,182 | 6/1967 | Kisinko | 317—235 |
| 3,370,995 | 2/1968 | Lowery et al. | 148—175 |

JOHN W. HUCKERT, Primary Examiner

J. R. SHEWMAKER, Assistant Examiner

U.S. Cl. X.R.

29—576, 578